(12) United States Patent
Qi et al.

(10) Patent No.: US 12,140,832 B2
(45) Date of Patent: Nov. 12, 2024

(54) DISPLAY DEVICE AND SPLICING SCREEN COMPRISING A FLEXIBLE CIRCUIT BOARD HAVING A FIRST PART AND A SECOND PART THAT EXTENDS OUTSIDE OF A LIQUID CRYSTAL DISPLAY SCREEN

(71) Applicants: Beijing BOE Display Technology Co., Ltd., Beijing (CN); BOE Technology Group Co., Ltd., Beijing (CN)

(72) Inventors: Jiakun Qi, Beijing (CN); Enliang Zhang, Beijing (CN)

(73) Assignees: Beijing BOE Display Technology Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 349 days.

(21) Appl. No.: 17/415,253

(22) PCT Filed: Dec. 28, 2020

(86) PCT No.: PCT/CN2020/140236
§ 371 (c)(1),
(2) Date: Jun. 17, 2021

(87) PCT Pub. No.: WO2021/169554
PCT Pub. Date: Sep. 2, 2021

(65) Prior Publication Data
US 2022/0404659 A1 Dec. 22, 2022

(30) Foreign Application Priority Data
Feb. 24, 2020 (CN) .......................... 202010113719.1

(51) Int. Cl.
G02F 1/1333 (2006.01)
G02F 1/1335 (2006.01)
(Continued)

(52) U.S. Cl.
CPC .... *G02F 1/13336* (2013.01); *G02F 1/133314* (2021.01); *G02F 1/133528* (2013.01);
(Continued)

(58) Field of Classification Search
CPC ..................................................... H05K 1/0277
See application file for complete search history.

(56) References Cited

U.S. PATENT DOCUMENTS

2012/0293741 A1* 11/2012 Gu ........................... G09G 3/36
349/190
2016/0202523 A1 7/2016 Xia et al.
(Continued)

FOREIGN PATENT DOCUMENTS

CN 102608779 A 7/2012
CN 102693681 A 9/2012
(Continued)

OTHER PUBLICATIONS

CN202010113719.1 First Office Action.
CN202010113719.1 Second Office Action.

*Primary Examiner* — Paul C Lee
(74) *Attorney, Agent, or Firm* — IPro, PLLC

(57) ABSTRACT

The present disclosure provides a display device and a splicing screen, relating to the field of display equipment. The display device includes a liquid crystal display screen, a lamp board, and a printed circuit board. The lamp board includes a flexible circuit board and a plurality of light-emitting diodes. The flexible circuit board includes a first part and a second part connected to each other. The light-emitting diodes are disposed on the first part, and the first part is disposed on an edge of a front surface of the liquid crystal display screen. The second part extends outside of the liquid crystal display screen to a rear surface of the liquid crystal display screen and is detachably plugged into the printed circuit board disposed on the rear surface. Since the (Continued)

first part is disposed on the edge of the front surface of the liquid crystal display, a picture displayed on the light-emitting diodes can block an edge region of the liquid crystal display screen. Therefore, when a plurality of display devices is spliced into a splicing screen, split seams can be reduced or even eliminated, thereby improving visual effect.

13 Claims, 6 Drawing Sheets

(51) Int. Cl.
*G02F 1/13357* (2006.01)
*H05K 1/02* (2006.01)

(52) U.S. Cl.
CPC ......... *G02F 1/1336* (2013.01); *H05K 1/0277* (2013.01); *H05K 2201/10106* (2013.01)

(56) References Cited

U.S. PATENT DOCUMENTS

| | | | |
|---|---|---|---|
| 2016/0357060 A1 | 12/2016 | Qin | |
| 2018/0173036 A1* | 6/2018 | Kim | ............... G02F 1/133524 |
| 2021/0135076 A1 | 5/2021 | Jung et al. | |

FOREIGN PATENT DOCUMENTS

| | | | | |
|---|---|---|---|---|
| CN | 104464557 A | | 3/2015 | |
| CN | 104570485 A | | 4/2015 | |
| CN | 106842711 A | | 6/2017 | |
| CN | 206557499 U | | 10/2017 | |
| CN | 207199233 U | * | 4/2018 | |
| CN | 207353253 U | | 5/2018 | |
| CN | 108205970 A | | 6/2018 | |
| CN | 108873482 A | * | 11/2018 | ....... G02F 1/133603 |
| CN | 111290154 A | | 6/2020 | |
| WO | 2020017820 A1 | | 1/2020 | |

* cited by examiner

DISPLAY DEVICE AND SPLICING SCREEN COMPRISING A FLEXIBLE CIRCUIT BOARD HAVING A FIRST PART AND A SECOND PART THAT EXTENDS OUTSIDE OF A LIQUID CRYSTAL DISPLAY SCREEN

CROSS-REFERENCE TO RELATED APPLICATIONS

This application is a 371 of International Application No. PCT/CN2020/140236, filed on Dec. 28, 2020, which claims priority to the Chinese Patent Application No. 202010113719.1, filed on Feb. 24, 2020 and entitled "DISPLAY DEVICE AND SPLICING SCREEN", the entire contents of both of which are herein incorporated by reference.

TECHNICAL FIELD

The present disclosure relates to the field of display equipment, and in particular to a display device and a splicing screen.

BACKGROUND

A liquid crystal display device is a common display device, which has advantages of small thickness and low weight, and is widely applied in people's daily life.

Due to a limited area of a single liquid crystal display device, when a large display area is required, a splicing screen is usually adopted. The splicing screen is a display device with a larger area formed by splicing a plurality of individual liquid crystal display devices after aligning their border edges. When splicing the liquid crystal display devices, splicing seams may be formed between adjacent liquid crystal display devices. The splicing seams may cause a picture displayed on the splicing screen to be divided, which destroys the continuity and integrity of the picture and seriously affects a visual effect of the splicing screen.

SUMMARY

Embodiments of the present disclosure provide a display device and a splicing screen, and technical solutions adopted are as follows.

In an aspect, embodiments of the present disclosure provide a display device. The display device includes a liquid crystal display screen, a lamp board and a printed circuit board, wherein the lamp board includes a flexible circuit board and a plurality of light-emitting diodes, the flexible circuit board includes a first part and a second part connected with each other; the light-emitting diodes are disposed on the first part, and the first part is disposed on an edge of a front surface of the liquid crystal display screen; the second part extends outside of the liquid crystal display screen to a rear surface of the liquid crystal display screen, and the printed circuit board is disposed on the rear surface; and the second part is detachably plugged into the printed circuit board.

Optionally, the second part includes an attaching portion and an extending portion; the first part, the attaching portion and the extending portion are sequentially connected; a surface of the attaching portion close to the liquid crystal display screen is attached to the edge of the front surface; the first part is superimposed on a surface of the attaching portion away from the liquid crystal display screen; and the extending portion is connected to the attaching portion and is detachably plugged into the printed circuit board.

Optionally, the first part extends from a middle part of the front surface outward over the edge of the front surface.

Optionally, the lamp board further includes a reinforcing plate having two opposite plate surfaces, a surface of the attaching portion away from the liquid crystal display screen is attached to a surface of the reinforcing plate close to the liquid crystal display screen, and the first part is attached to a surface of the reinforcing plate away from the liquid crystal display screen.

Optionally, the edge of the front surface of the liquid crystal display screen is configured with a step surface for positioning the lamp board, and the lamp board is attached to the step surface.

Optionally, the liquid crystal display screen includes a display panel and a polarizer disposed on a side surface of the display panel, an orthographic projection of the polarizer on the display panel is within the display panel, and the polarizer and a part of the display panel exceeding the polarizer provide the step surface.

Optionally, the front surface of the liquid crystal display screen includes a display area disposed in a middle part of the front surface and a non-display area disposed in the edge of the front surface, and one side of an orthographic projection of the lamp board on the front surface coincides with a boundary between the display area and the non-display area.

Optionally, the front surface of the liquid crystal display screen has a polygonal shape, at least two lamp boards are arranged on the same side of the front surface, and respective lamp boards are continuously arranged along an edge of the front surface.

Optionally, the printed circuit board is disposed at an edge of the rear surface, and the lamp board and the printed circuit board are disposed on the same side of the liquid crystal display screen.

Optionally, the display device further includes a rear cover disposed on the rear surface of the liquid crystal display screen, the printed circuit board is disposed in a space enclosed by the rear cover and the liquid crystal display screen, and the rear cover has a hole through which the flexible circuit board passes.

Optionally, the rear cover has a side wall connected with the liquid crystal display screen, and the hole is disposed on the side wall.

Optionally, the hole has a strip shape and is parallel to the rear surface of the liquid crystal display screen, and a middle part of a side of the hole away from the rear surface has an avoidance notch.

Optionally, the light-emitting diodes are arranged in an array, and a pitch between each two adjacent light-emitting diodes is the same as a pixel pitch of the liquid crystal display screen.

Optionally, the lamp board further includes a light transmissive shade, and the light transmissive shade encloses the light-emitting diodes.

In another aspect, embodiments of the present disclosure further provide a splicing screen. The splicing screen includes at least two display devices spliced mutually, wherein the at least two display devices include at least one display device according to the above aspect.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely an embodiment of the present disclosure, and a person of ordinary skill in the art may still derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

Figure 1:
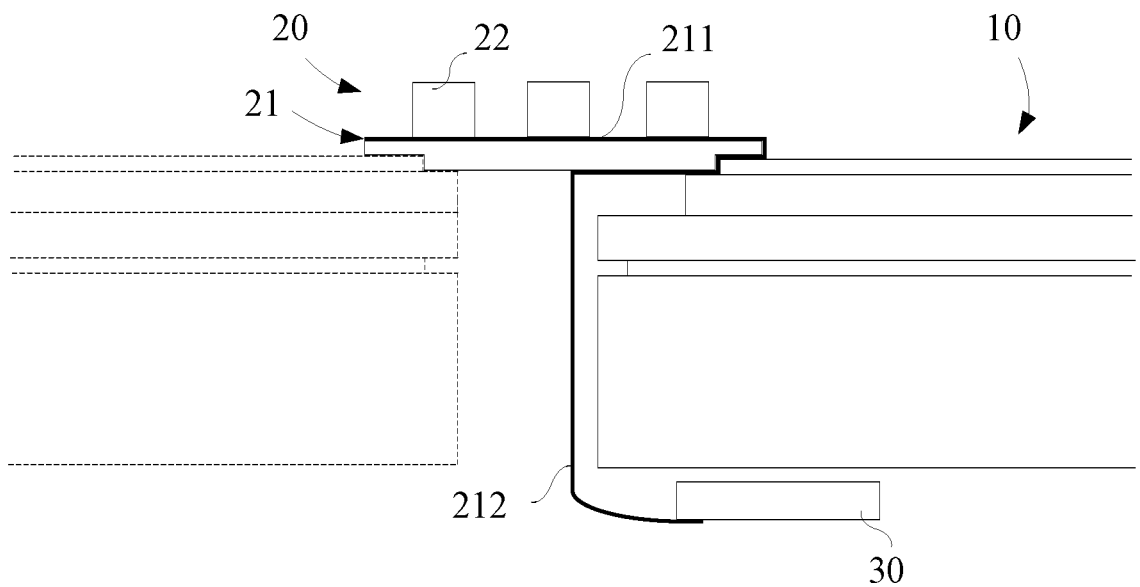
FIG. 1 is a structural diagram of a display device according to an embodiment of the present disclosure.

FIG. 1 is a structural diagram of a display device according to an embodiment of the present disclosure. As shown in FIG. 1, the display device includes a liquid crystal display screen 10, a lamp board 20, and a printed circuit board 30. The lamp board 20 includes a flexible circuit board 21 and a plurality of light-emitting diodes 22. A broken-line drawn structure in FIG. 1 is another display device for splicing.

As shown in FIG. 1, the flexible circuit board 21 includes a first part 211 and a second part 212 that are connected with each other. A plurality of light-emitting diodes 22 are disposed on the first part 211. The first part 211 is disposed on an edge of a front surface of the liquid crystal display screen 10, and the second part 212 extends outside of the liquid crystal display screen 10 to a rear surface of the liquid crystal display screen 10.

In the embodiment of the present disclosure, the front surface is a surface of the liquid crystal display screen 10 for displaying pictures, and the rear surface is a surface of the liquid crystal display screen 10 opposite to the front surface. The printed circuit board 30 is disposed on the rear surface of the liquid crystal display screen 10, and the second part 212 is detachably plugged into the printed circuit board 30.

The liquid crystal display screen, the lamp board and the printed circuit board are arranged, and the front side of the liquid crystal display screen can display pictures; the lamp board includes the flexible circuit board and the light-emitting diodes. Since the flexible circuit board includes the first part and the second part connected with each other, wherein the light-emitting diodes are disposed on the first part which is in turn disposed on the edge of the front surface of the liquid crystal display screen, and the second part extends outside of the liquid crystal display screen to the rear surface of the liquid crystal display screen and is detachably plugged into the printed circuit board, the light-emitting diodes may be controlled by the printed circuit board to display pictures. In addition, since the first part is disposed on the edge of the front surface of the liquid crystal display, a picture displayed on the light-emitting diodes can block an edge region of the liquid crystal display screen. Therefore, when a plurality of display devices is spliced into a splicing screen, split seams can be reduced or even eliminated, thereby improving a visual effect.

Further, since the second part 212 of the flexible circuit board 21 extends outside of the liquid crystal display screen 10 to the rear surface of the liquid crystal display screen 10 and is detachably connected with the printed circuit board 30 disposed on the rear surface of the liquid crystal display screen 10, when a light-emitting diode 22 fails, the second part 212 and the printed circuit board 30 can be disconnected while the first part 211 and the front surface of the liquid crystal display screen 10 can be disconnected, the lamp board 20 can be removed for repair or can be directly replaced with a new lamp board 20; and when assembling, it is sufficient to install the lamp board 20 on the front surface of the liquid crystal display screen 10 and to connect the second part 212 with the printed circuit board 30, that is, it is unnecessary to disassemble the liquid crystal display screen 10, which is convenient for repair.

Optionally, the light-emitting diodes 22 may be arranged in the same fashion as pixels of the liquid crystal display screen 10, so that a display effect of the lamp board 20 is closer to that of the liquid crystal display screen 10.

In the embodiment of the present disclosure, a plurality of light-emitting diodes 22 are distributed in an array, and a pitch of adjacent light-emitting diodes 22 may be the same as a pixel pitch of the liquid crystal display screen 10. By arranging the pitch of the light-emitting diodes 22 according to the pixel pitch of the liquid crystal display screen 10, the display effect of the lamp board 20 may become closer to that of the liquid crystal display screen 10, which is beneficial to improve an overall display effect of the display device and the splicing screen.

Optionally, colors of the light-emitting diodes 22 may also be the same as that of pixels of the liquid crystal display screen 10. In an embodiment, the light-emitting diodes 22 may include red light-emitting diodes, green light-emitting diodes, and blue light-emitting diodes. The liquid crystal display screen 10 usually has pixels in three colors of red, green, and blue, and by adopting a color configuration of red, green and blue for the light-emitting diodes 22, the display effect of the lamp board 20 may become closer to that of the liquid crystal display screen 10.

The light-emitting diode 22 may be a packaged light-emitting diode 22, and the packaged light-emitting diode 22 has a longer service life.

Figure 2:
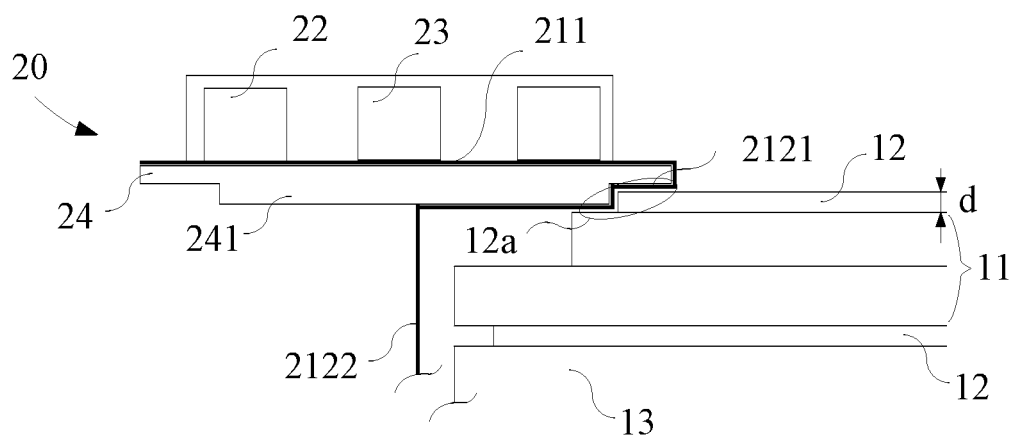
FIG. 2 is a schematic partial structural diagram of a display device according to an embodiment of the present disclosure.

FIG. 2 is a schematic partial structural diagram of a display device according to an embodiment of the present disclosure. As shown in FIG. 2, the lamp board 20 may further include a light transmissive shade 23. The light transmissive shade 23 may enclose the light-emitting diodes 22, protect the light-emitting diode 22 and soften light emitted by the light-emitting diodes 22, so as to avoid particular glare viewed from a certain direction. The light transmissive shade 23 may be bonded to the flexible circuit board 21.

In an embodiment, the light transmissive shade 23 may be made of an optical resin to facilitate light transmission.

All the light-emitting diodes 22 on the lamp board 20 may be disposed in the same light transmissive shade 23. Alternatively, the lamp board 20 may also include a plurality of light transmissive shades 23, and each light transmissive shade 23 is provided with several light-emitting diodes 22, for example, each light transmissive shade 23 is provided with one light-emitting diode 22, or each transmissive shade 23 is provided with three light-emitting diodes 22.

As shown in FIG. 2, the second part 212 of the flexible circuit board 21 may include an attaching portion 2121 and an extending portion 2122. The first part 211, the attaching portion 2121, and the extending portion 2122 are connected in sequence. A surface of the attaching portion close to the liquid crystal display screen 2121 is attached to the edge of the front surface. The first part 211 is superimposed on a surface of the attaching portion 2121 away from the liquid crystal display screen 10, and the extending portion 2122 is connected to the attaching portion 2121 and is detachably plugged into the printed circuit board 30. The flexible circuit board 21 is installed on the front surface of the liquid crystal display screen 10 through the attaching portion 2121 of the second part 212, and the extending portion 2122 may pass a side surface of the liquid crystal display screen 10 and be connected to the printed circuit board 30 disposed on the rear surface of the liquid crystal display screen 10. The side surface of the liquid crystal display screen 10 is a surface connecting the rear surface of the liquid crystal display screen 10 and the front surface of the liquid crystal display screen 10. In this way, once the flexible circuit board 21 and the printed circuit board 30 is disconnected and the attaching portion 2121 and the front surface of the liquid crystal display screen 10 is disconnected, the lamp board 20 may be removed so as to detach the lamp board 20.

The first part 211 may extend from a middle part of the front surface of the liquid crystal display screen 10 outward over the edge of the front surface of the liquid crystal display screen 10. In this way, when preparing a splicing screen, a part of the first part 211 exceeding the edge of the front surface may be overlapped on an adjacent display device, so as to block a non-display area of the adjacent display device and reduce splicing seams.

The liquid crystal display screen 10 may be a flat display screen or a curved display screen. By using the flat display screen, a flat display screen with a larger area or a curved display screen with a larger area may be formed by splicing; and by using the curved display screen, a curved display screen with a larger area may be formed by splicing. Since the flexible circuit board 21 is bendable, when forming a curved display screen by splicing, the flexible circuit board 21 may be bent by a certain degree, so that the lamp board 20 fits curvature of the curved display screen more closely, thereby further improving the visual effect.

The lamp board 20 may be bonded on the liquid crystal display screen 10. In an embodiment, the lamp board 20 may be bonded by an adhesive tape. For example, double-sided resin pressure-sensitive adhesive tape may be used for bonding. A thickness of the double-sided resin pressure-sensitive adhesive tape may be 0.008 mm~0.012 mm. Due to a low thickness, the double-sided resin pressure-sensitive adhesive tape may be beneficial in bonding for reducing a height difference between the lamp board 20 and the liquid crystal display screen 10, thereby further improving the visual effect of the display device.

Figure 3:
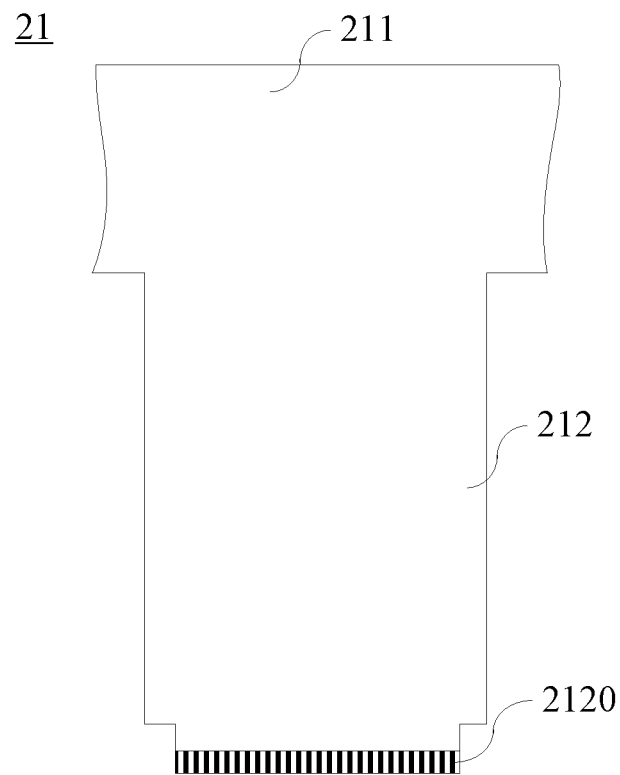
FIG. 3 is an unfolded structural diagram of the flexible circuit board in FIG. 2.

FIG. 3 is an unfolded structural diagram of the flexible circuit board in FIG. 2. As shown in FIG. 3, the second part 212 of the flexible circuit board 21 may be provided with a gold finger 2120, the printed circuit board 30 may be provided with a gold finger connector, and the second part 212 of the flexible circuit board 21 may be plugged into the gold finger connector by the gold finger. It is convenient for disassembly and assembly by forming a connection with the gold finger and the gold finger connector.

Figure 4:
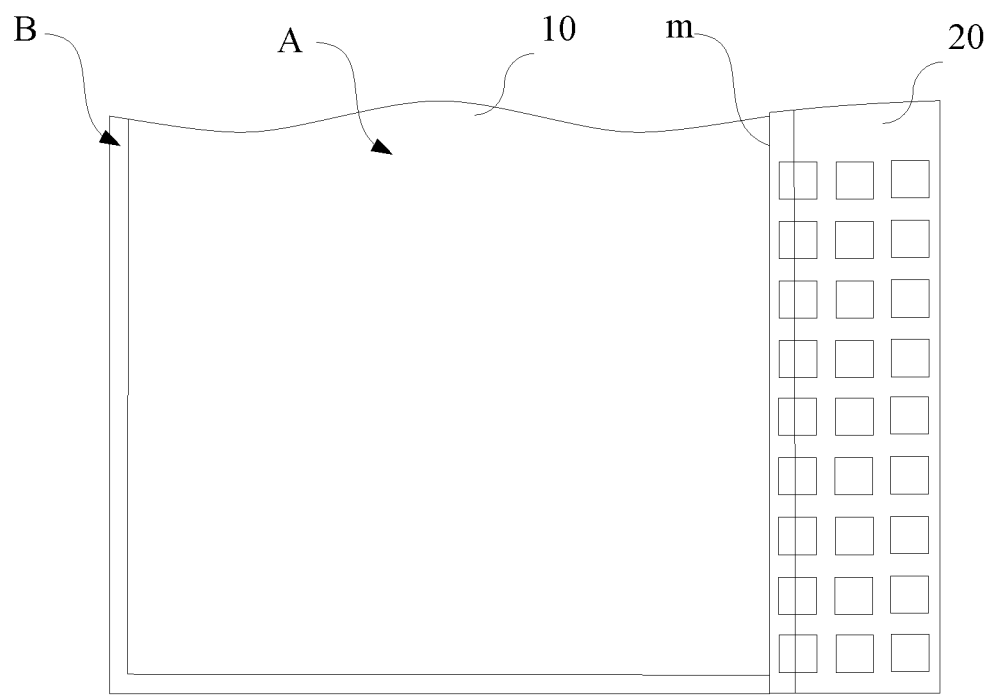
FIG. 4 is a top view of a display device according to an embodiment of the present disclosure.

FIG. 4 is a top view of a display device according to an embodiment of the present disclosure. As shown in FIG. 4, the front surface of the liquid crystal display screen 10 includes a display area A disposed in the middle part of the front surface and a non-display area B disposed at the edge of the front surface. The non-display area B surrounds the display area A, and the non-display area B is disposed at an edge of each side of the front surface. One side of an orthographic projection of the lamp board 20 on the front surface may coincide with a boundary m between the display area A and the non-display area B. When splicing the liquid crystal display screen 10, the non-display area B of the liquid crystal display screen 10 forms a splicing seam of a splicing screen. By arranging the lamp board 20 on the edge of the liquid crystal display screen 10 and coinciding one side of the orthographic projection of the lamp board 20 on the front surface with the boundary m between the display region A and the non-display area B, the first part 211 may extend along the edge of the front surface, and the lamp board 20 may completely block the non-display area B. Therefore, splicing seams are eliminated without blocking a picture displayed on the display region A.

As shown in FIG. 4, the orthographic projection of the lamp board 20 on the front surface may have a rectangular shape, that is, the first part 211 may have a rectangular shape. A splicing seam between two adjacent liquid crystal display screens 10 in a splicing screen usually has a rectangular shape, and the rectangular orthographic projection of the lamp board 20 on the front surface may better block the splicing seam.

Optionally, as shown in FIG. 2, the lamp board 20 may further include a reinforcing plate 24. The reinforcing plate 24 has two opposite plate surfaces. A surface of the attaching portion close to the liquid crystal display screen 2121 may be attached to the front surface of the liquid crystal display screen 10, a surface of the attaching portion away from the liquid crystal display screen 2121 may be attached to a surface of the reinforcing plate close to the liquid crystal display screen 24, and the first part 211 may be attached to a surface of the reinforcing plate away from the liquid crystal display screen 24. The reinforcing plate 24 may support the flexible circuit board 21. By providing the reinforcing plate 24, strength of the lamp board 20 is improved, so as to prevent the flexible circuit board 21 from being damaged.

Optionally, the reinforcing plate 24 may be a flat plate or a curved plate. When forming a flat display screen by splicing, the reinforcing plate 24 of the lamp board 20 may be a flat plate. When forming a curved display screen by splicing, the reinforcing plate 24 of the lamp board 20 may be a curved plate, so that the lamp board 20 may better fit curvature of the curved display screen, thereby further improving the visual effect.

In an embodiment, the reinforcing plate 24 may be made of PET (Polyethylene glycol terephthalate) or PI (Polyimide).

Optionally, the edge of the front surface of the liquid crystal display screen 10 may have a step surface 12a for positioning the lamp board 20. FIG. 2 may be referred to for a structure of the liquid crystal display screen 10. The liquid crystal display screen 10 may include a display panel 11, a polarizer 12, and a backlight source 13. One polarizer 12 is provided on each of two sides of the display panel 11. The backlight source 13 may be an edge-type backlight source or a direct-type backlight source. In addition to the polarizer 12, other optical films may be disposed between the backlight source 13 and the display panel 11. The optical films may include, but are not limited to, diffusers and prism films. An orthographic projection of the polarizer 12 on a side surface of the display panel 11 away from the backlight source 13 is within the display panel 11, so that the polarizer 12 and a part of the display panel 11 exceeding the polarizer 12 provide the step surface 12a.

The lamp board 20 may be attached to the step surface 12a. By attaching the lamp board 20 to the step surface 12a and positioning the lamp board 20 by the step surface 12a, it is convenient for the lamp board 20 to be installed to the front surface of the liquid crystal display screen 10, and installing accuracy of the lamp board 20 is improved. Further, by positioning with the step surface 12a, one side of the orthographic projection of the lamp board 20 on the front surface just coincides with the boundary m between the display area A and the non-display area B, so as to completely block the non-display area B, eliminate splicing seams, and avoid blocking a picture displayed in the display area A. In this way, when the display device is displaying, a picture displayed on the liquid crystal display screen 10 and a picture displayed on the lamp board 20 may be better spliced into one picture, thereby improving the overall visual effect of the splicing screen.

Figure 5:
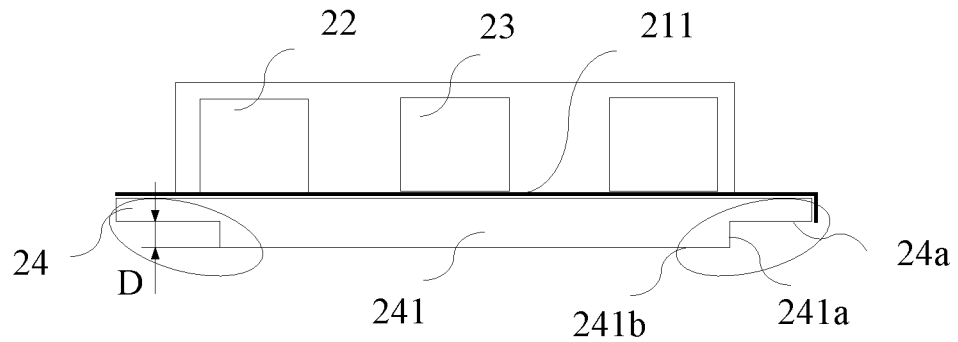
FIG. 5 is a schematic partial structural view of FIG. 2.

FIG. 5 is a schematic partial structural diagram of FIG. 2. As shown in FIG. 5, a plate surface of the reinforcing plate 24 away from the first part 211 of the flexible circuit board 21 may have a positioning boss 241. By providing the positioning boss 241, a partial surface of the reinforcing plate 24 (such as a surface 24a in FIG. 5), one side surface of the positioning boss 241 (such as a surface 241a in FIG. 5) and a top surface of the positioning boss 241 (such as a surface 241b in FIG. 5) constitute a step structure (such as a structure enclosed by each broken-line drawn ellipse in FIG. 5). In this way, when the lamp board 20 is installed, the step structure on the reinforcing plate 24 may be matched with the polarizer 12 and the display panel 11, so that the lamp board 20 may be attached to the step surface 12a formed by the polarizer 12 and the display panel 11 to implement positioning of the lamp board 20.

A height D of the positioning boss 241 may be set according to a thickness d of the polarizer 12. For example, the height D of the positioning boss 241 may be the same as the thickness d of the polarizer 12, so that the lamp board 20 may fit a surface of the liquid crystal display screen 10 well. Thicknesses of the two polarizers 12 may be the same, the thickness d of each polarizer 12 may be 0.15 mm~0.2 mm, and the height D of the positioning boss 241 may also be 0.15 mm~0.2 mm.

Figure 6:
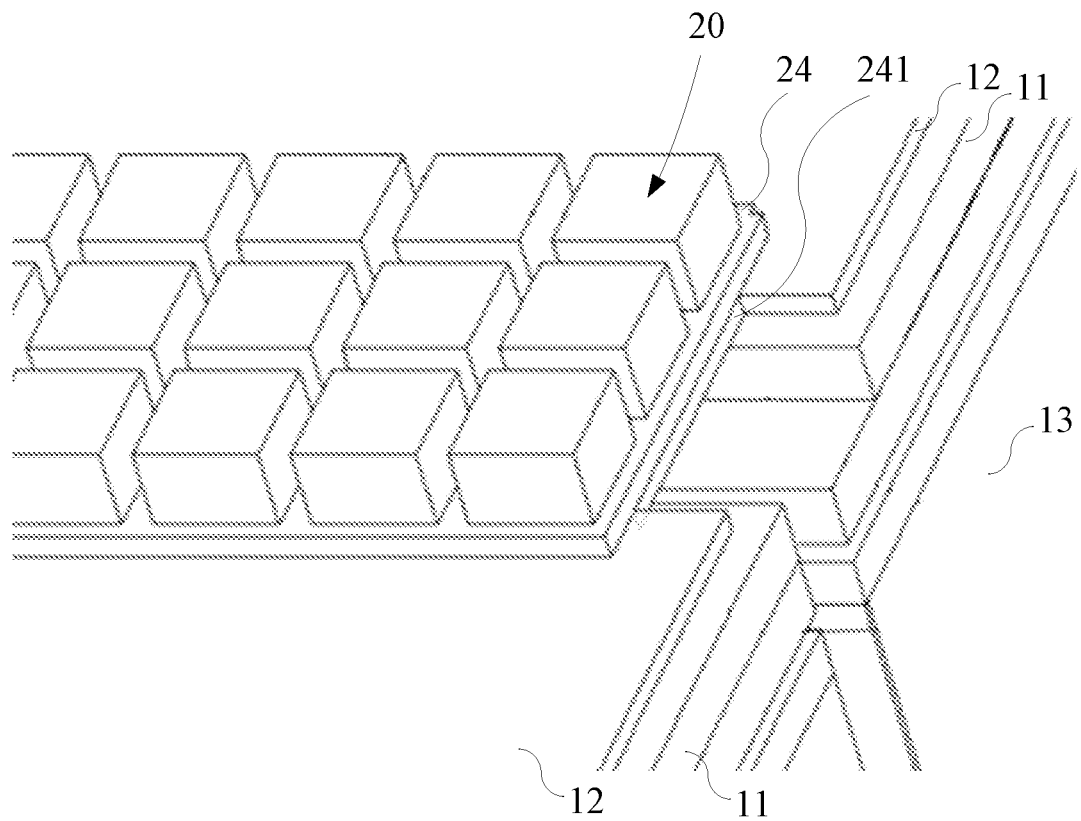
FIG. 6 is a schematic diagram of a splicing manner of a display device and another display device according to an embodiment of the present disclosure.

The positioning boss 241 may be disposed in a middle part of the reinforcing plate 24, so that two step structures are formed on the lamp board 20. FIG. 6 is a schematic diagram of a splicing manner of a display device and another display device according to an embodiment of the present disclosure. As shown in FIG. 6, when assembling a splicing screen, the two step structures are respectively matched with two liquid crystal display screens 10 spliced together.

Figure 7:
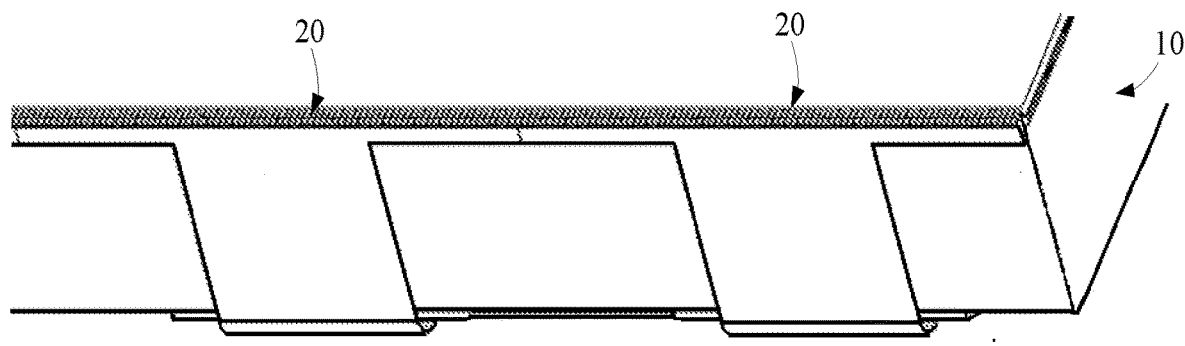
FIG. 7 is a schematic partial structural diagram of a display device according to an embodiment of the present disclosure.

FIG. 7 is a schematic partial structural diagram of a display device according to an embodiment of the present disclosure. The front surface of the liquid crystal display screen of the display device has a polygonal shape. As shown in FIG. 7, two lamp boards 20 are arranged on the same side of the front surface of the liquid crystal display screen 10, and the two lamp boards 20 are continuously arranged along an edge of the front surface. The continuous arrangement means that the lamp boards 20 are arranged in sequence and there is no gap between adjacent lamp boards 20. For a liquid crystal display screen 10 with a larger area, by arranging two lamp boards 20 on the same side of the front surface, a size of the flexible circuit board 21 in a single lamp board 20 may be reduced, so as to reduce manufacturing difficulty.

In other possible embodiments, three or more lamp boards 20 may be arranged along the same side of the front surface of the liquid crystal display screen 10. The respective lamp boards 20 may be arranged along an edge of the front surface, and an arrangement number of the lamp boards 20 may be determined according to a size of the liquid crystal display screen 10.

Liquid crystal display screens 10, used in a splicing screen, generally have a rectangular shape and a lamp board 20 may be provided on any side of the front surface of the liquid crystal display screen 10. In an embodiment, lamp boards 20 may be provided on one side, two adjacent sides, two non-adjacent sides, three sides or four sides of the front surface of the liquid crystal display screen 10.

Figure 8:
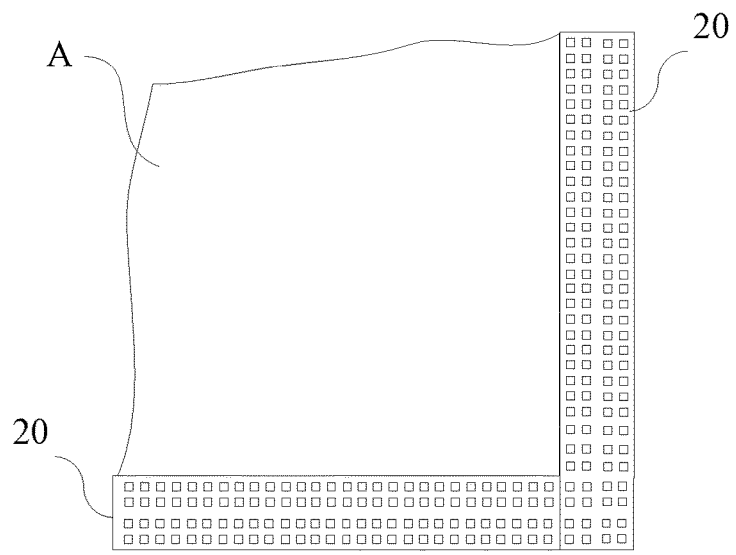
FIG. 8 is a schematic partial diagram of a display device according to an embodiment of the present disclosure.

FIG. 8 is a schematic partial diagram of a display device according to an embodiment of the present disclosure. As shown in FIG. 8, two adjacent sides of the front surface of the liquid crystal display screen 10 may be provided with lamp boards 20, so that multiple identical display devices may be spliced to form a splicing screen with a sufficiently large 30) area.

Figure 9:
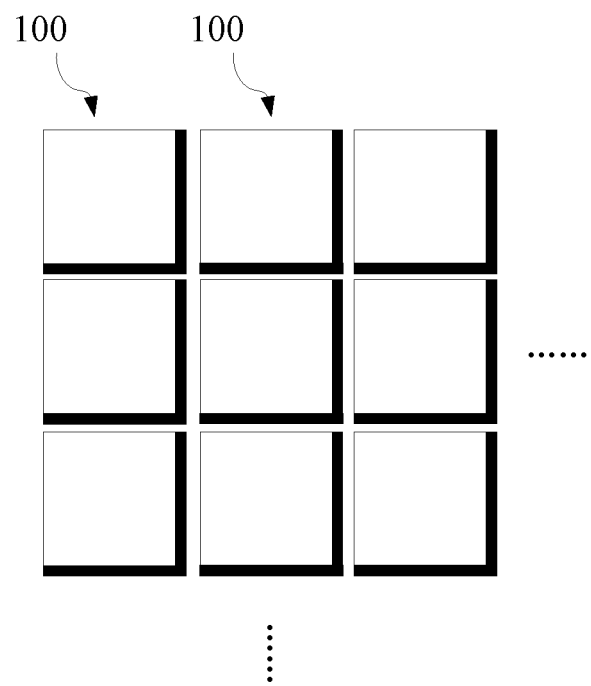
FIG. 9 is a schematic diagram of a splicing manner according to an embodiment of the present disclosure.

FIG. 9 is a schematic diagram of a splicing manner according to an embodiment of the present disclosure, and thicker black lines in FIG. 9 represent lamp boards 20. As shown in FIG. 9, by splicing a plurality of display devices 100 shown in FIG. 8 in a fashion as shown in FIG. 9, a splicing screen with any size may be formed to meet different needs.

Figure 10:
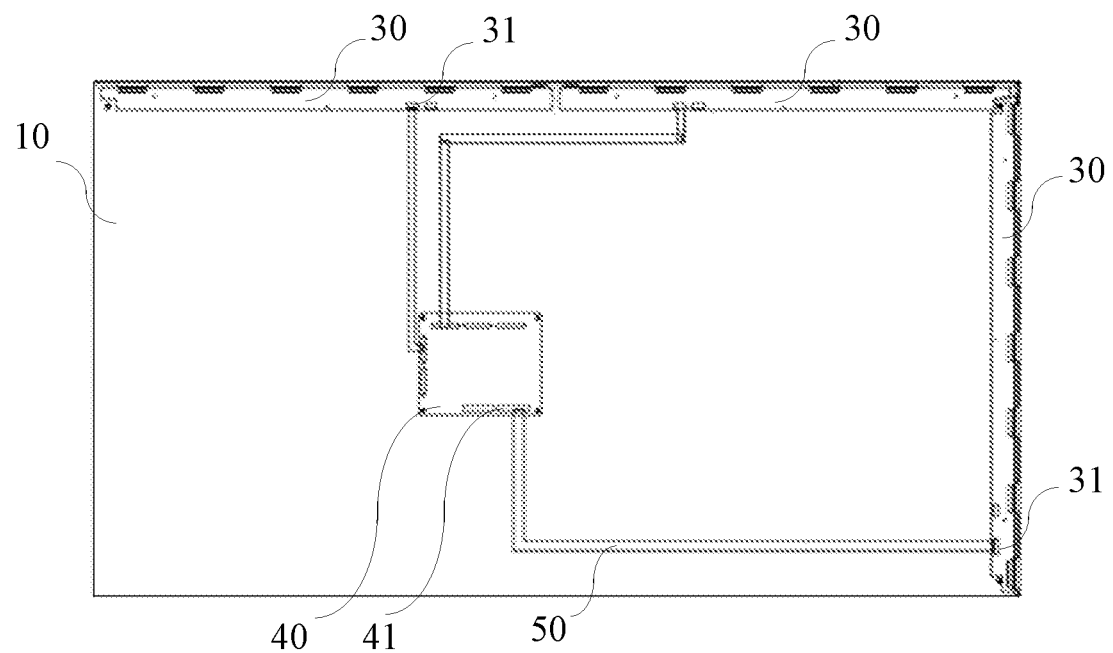
FIG. 10 is a schematic diagram of a rear structure of a display device according to an embodiment of the present disclosure.

The lamp board 20 and the printed circuit board 30 may be disposed on the same side of the liquid crystal display screen 10, so that the second part 212 of the flexible circuit board 21 may be connected to the printed circuit board 30 by being set with a short length. FIG. 10 is a schematic diagram of a rear structure of a display device according to an embodiment of the present disclosure. As shown in FIG. 10, the printed circuit board 30 may be disposed at an edge of the rear surface of the liquid crystal display screen 10. By arranging the lamp board 20 and the printed circuit board 30 on the same side of the liquid crystal display screen and arranging the printed circuit board 30 at an edge position, it is convenient to plug the flexible circuit board 21 into the printed circuit board 30.

Optionally, the printed circuit board 30 may extend along the edge of the rear surface of the liquid crystal display screen 10. In this way, in a case that the same side of the front surface of the liquid crystal display screen 10 is arranged with two or more lamp boards 20, the lamp boards 20 arranged on the same side of the front surface may be conveniently connected to the printed circuit board 30.

Optionally, two or more printed circuit boards 30 may be arranged on the same side of the rear surface of the liquid crystal display screen 10, and the respective printed circuit boards 30 are arranged along an edge of the rear surface. Such an arrangement is particularly suitable for a liquid crystal display screen 10 with a larger size, and is beneficial to reduce an area of a single printed circuit board 30.

The rear surface of the liquid crystal display screen 10 may also be provided with a control circuit 40, and the control circuit 40 may be connected to the printed circuit board 30. The control circuit 40 may be used to process a picture to be displayed, divide the picture to be displayed, provide a middle part of the picture to be displayed to the liquid crystal display screen 10, and provide an edge part of the picture to be displayed to the printed circuit board 30, so that the liquid crystal display screen 10 may display the middle part of the picture to be displayed, and the lamp board 20 may display the edge part of the picture to be displayed. The control circuit 40 may process the picture to be displayed according to related technologies, which are not described in detail here.

In an embodiment, the control circuit 40 may be fixed in a middle part of the rear surface of the liquid crystal display screen 10. In these embodiments, by arranging both the printed circuit board 30 and the control circuit 40 on the rear surface of the liquid crystal display screen 10, it is convenient for repair.

As shown in FIG. 10, in a case that the rear surface of the liquid crystal display screen 10 is provided with a plurality of printed circuit board 30, the plurality of printed circuit boards 30 may be connected to the control circuit 40.

The control circuit 40 and the printed circuit board 30 may be connected via a data transmission line 50. The control circuit 40 may have a first transmission line interface 41, and the printed circuit board 30 may have a second transmission line interface 31. By providing the first transmission line interface 41 and the second transmission line interface 31, it is convenient to connect and disconnect the data transmission line 50. The control circuit 40 may have multiple first transmission line interfaces 41 so as to easily connect multiple printed circuit boards 30.

Figure 11:
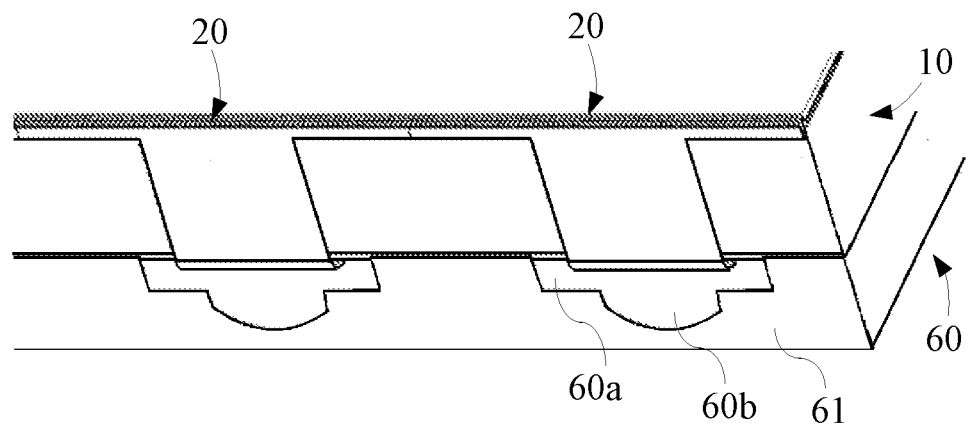
FIG. 11 is a schematic partial structural diagram of a display device according to an embodiment of the present disclosure.

FIG. 11 is a schematic partial structural diagram of a display device according to an embodiment of the present disclosure. As shown in FIG. 11, the display device may further include a rear cover 60. The rear cover 60 is disposed on the rear surface of the liquid crystal display screen 10, and the printed circuit board 30 is disposed in a space enclosed by the rear cover 60 and the liquid crystal display screen 10. The rear cover 60 has a hole 60a, and the flexible circuit board 21 is disposed in the hole 60a. The rear cover 60 may serve to protect the printed circuit board 30 from damaging, so as to assure normal operation of the display device. When disassembling the display device, the flexible circuit board 21 of the lamp board 20 may be connected to the printed circuit board 30 through the hole 60a, or the printed circuit board 30 may be disconnected from the printed circuit board 30 by removing the flexible circuit board 21 from the printed circuit board 30 through the hole 60a.

In the display device, the aforementioned control circuit 40 may also be disposed in the space enclosed by the rear cover 60 and the liquid crystal display screen 10 to protect the control circuit 40. An orthogonal projection of the rear cover 60 on the rear surface of the liquid crystal display screen 10 may coincide with the liquid crystal display screen 10 so as to enclose the entire rear surface of the liquid crystal display screen 10 within the rear cover, thereby providing better protection.

As shown in FIG. 11, the rear cover 60 may have a side wall connected to the liquid crystal display screen 10, and the hole 60a may be disposed in the side wall 61. By providing the hole 60a in the side wall 61, it is convenient to plug the flexible circuit board 21 into the hole 60a, so as to facilitate operations of disassembling and assembling the liquid crystal display screen 10 and the lamp board 20. In addition, when disassembling the rear cover 60, the hole 60a on the side wall 61 of the rear cover 60 may serve as a focus point, which is convenient for an operator to put his/her fingers therein so as to remove the rear cover 60.

The side wall 61 of the rear cover 60 may be parallel or coplanar with a side surface of the liquid crystal display screen 10. In this way, it is easier for an operator to disconnect and connect the flexible circuit board 21.

In an embodiment, the hole 60a may have a strip shape. The hole 60a may be parallel to the rear surface of the liquid crystal display screen 10, and a middle part of a side of the hole 60a away from the rear surface may also have an avoidance notch 60b. The strip-shaped hole 60a is parallel to the rear surface of the liquid crystal display screen 10, so that the flexible circuit board 21 may easily extend into the rear cover 60, and the flexible circuit board 21 may be prevented from being twisted. By providing the avoidance notch 60b in the middle part of the side of the hole 60a away from the rear surface, when disassembling the liquid crystal display screen 10 and the lamp board 20, an operator may put his/her fingers into the rear cover 60 through the avoidance notch 60b for operation, which is convenient for plugging the flexible circuit board 21 into the printed circuit board 30 or separating the flexible circuit board 21 from the printed circuit board 30.

As shown in FIG. 11, the avoidance notch 60b may have an arcuate shape. The arcuate-shaped avoidance notch 60b has a smooth outline, which is beneficial to reduce stress concentration and avoid scratching an operator. In other possible embodiments, the avoidance notch 60b may also be set in other shapes, such as a rectangle shape, a trapezoid shape, and the like. A size of the avoidance notch 60b may be as small as possible as long as the operator's fingers may pass the avoidance notch 60b and operate, so that external dust and water droplets cannot easily enter the display device 100 through the avoidance notch 60b.

Optionally, the rear cover 60 may be a transparent structure, so that an operator may directly observe structures behind the rear cover 60 through the rear cover 60, and it is more convenient to connect the flexible circuit board 21 to the printed circuit board 30. In an embodiment, the rear cover 60 may be made of an optical resin.

Figure 12:
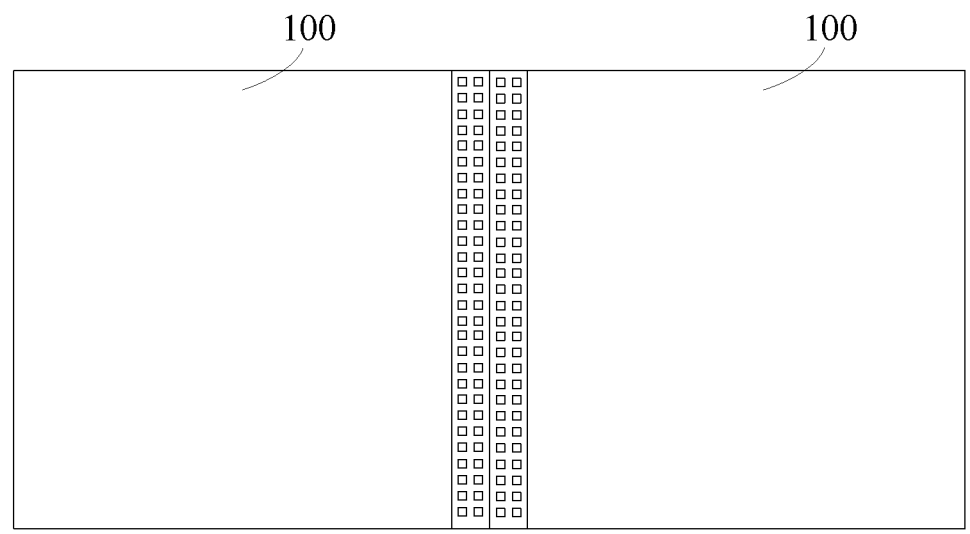
FIG. 12 is a schematic partial structural diagram of a splicing screen according to an embodiment of the present disclosure.

FIG. 12 is a schematic partial structural diagram of a splicing screen according to an embodiment of the present disclosure. As shown in FIG. 12, the splicing screen includes two display devices 100 spliced with each other, and at least one of the two display devices 100 is any one of the display devices shown in FIG. 1 to FIG. 11.

In other possible embodiments of the present disclosure, the splicing screen may include three or more mutually spliced display devices 100, wherein at least one display device 100 is any one of the display devices shown in FIG. 1 to FIG. 11.

In embodiments of the present disclosure, the liquid crystal display screen, the lamp board and the printed circuit board are arranged; the lamp board includes the flexible circuit board and the light-emitting diodes. Since the flexible circuit board includes the first part and the second part connected with each other, wherein the light-emitting diodes are disposed on the first part which is in turn disposed on the edge of a front surface of the liquid crystal display screen, and the second part extends outside of the liquid crystal display screen to the rear surface of the liquid crystal display screen and is detachably plugged into the printed circuit board, the light-emitting diodes may be controlled by the printed circuit board to display pictures. In addition, since the first part is disposed on the edge of the front surface of the liquid crystal display, a picture displayed on the light-emitting diodes can block an edge region of the liquid crystal display screen. Therefore, when a plurality of display devices is spliced into a splicing screen, split seams can be reduced or even eliminated, thereby improving a visual effect. Further, since the lamp board is installed on the liquid crystal display screen and the second part extends outside of the liquid crystal display screen to the rear surface of the liquid crystal display screen and can be detachably plugged into the printed circuit board, when a light-emitting diode fails, the second part and the printed circuit board can be disconnected while the first part and the front surface of the liquid crystal display screen can be disconnected, the lamp board can be removed for repair or can be directly replaced with a new lamp board; and when assembling, it is sufficient to install the lamp board on the front surface of the liquid crystal display screen and to connect the second part with the printed circuit board, that is, it is unnecessary to disassemble the liquid crystal display screen, which is convenient for repair.

Described above are merely exemplary embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A splicing screen, which comprises at least two display devices spliced mutually, wherein each of at least one of the display devices comprises a liquid crystal display screen, a lamp board and a printed circuit board, wherein
the lamp board comprises a flexible circuit board and a plurality of light-emitting diodes, the flexible circuit board comprises a first part and a second part connected with each other; the light-emitting diodes are disposed on the first part, and the first part is disposed on an edge of a front surface of the liquid crystal display screen; the second part extends outside of the liquid crystal display screen to a rear surface of the liquid crystal display screen,
the printed circuit board is disposed on the rear surface, and the second part is detachably plugged into the printed circuit board; and
the second part comprises an attaching portion and an extending portion; the first part, the attaching portion and the extending portion are sequentially connected; a surface of the attaching portion close to the liquid crystal display screen is attached to the edge of the front surface; the first part is superimposed on a surface of the attaching portion away from the liquid crystal display screen; and the extending portion is connected to the attaching portion and is detachably plugged into the printed circuit board.

2. The splicing screen according to claim 1, wherein the first part extends from a middle part of the front surface outward over the edge of the front surface.

3. The splicing screen according to claim 1, wherein the lamp board further comprises a reinforcing plate having two opposite plate surfaces, a surface of the attaching portion away from the liquid crystal display screen is attached to a surface of the reinforcing plate close to the liquid crystal display screen, and the first part is attached to a surface of the reinforcing plate away from the liquid crystal display screen.

4. The splicing screen according to claim 1, wherein the edge of the front surface of the liquid crystal display screen is configured with a step surface for positioning the lamp board, and the lamp board is attached to the step surface.

5. The splicing screen according to claim 4, wherein the liquid crystal display screen comprises a display panel and a polarizer disposed on a side surface of the display panel, an orthographic projection of the polarizer on the display panel is within the display panel, and the polarizer and a part of the display panel exceeding the polarizer provide the step surface.

6. The splicing screen according to claim 1, wherein the light-emitting diodes are arranged in an array, and a pitch between each two adjacent light-emitting diodes is the same as a pixel pitch of the liquid crystal display screen.

7. The splicing screen according to claim 1, wherein the front surface of the liquid crystal display screen comprises a display area disposed in a middle part of the front surface and a non-display area disposed in the edge of the front surface, and one side of an orthographic projection of the lamp board on the front surface coincides with a boundary between the display area and the non-display area.

8. The splicing screen according to claim 1, wherein the front surface of the liquid crystal display screen has a polygonal shape, at least two lamp boards are arranged on the same side of the front surface, and respective lamp boards are continuously arranged along an edge of the front surface.

9. The splicing screen according to claim 8, wherein the printed circuit board is disposed at an edge of the rear surface, and the lamp board and the printed circuit board are disposed on the same side of the liquid crystal display screen.

10. The splicing screen according to claim 1, wherein the display device further comprises a rear cover disposed on the rear surface of the liquid crystal display screen, the printed circuit board is disposed in a space enclosed by the rear cover and the liquid crystal display screen, and the rear cover has a hole through which the flexible circuit board passes.

11. The splicing screen according to claim 10, wherein the rear cover has a side wall connected with the liquid crystal display screen, and the hole is disposed on the side wall.

12. The splicing screen according to claim 11, wherein the hole has a strip shape and is parallel to the rear surface of the liquid crystal display screen, and a middle part of a side of the hole away from the rear surface has an avoidance notch.

13. The splicing screen according to claim 1, wherein the lamp board further comprises a light transmissive shade, and the light transmissive shade encloses the light-emitting diodes.

* * * * *